(12) United States Patent
Li et al.

(10) Patent No.: US 11,664,794 B2
(45) Date of Patent: May 30, 2023

(54) SUBSTRATE-ENHANCED COMPARATOR AND ELECTRONIC DEVICE

(71) Applicants: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

(72) Inventors: Ting Li, Chongqing (CN); Zhengbo Huang, Chongqing (CN); Yong Zhang, Chongqing (CN); Yabo Ni, Chongqing (CN); Jian'an Wang, Chongqing (CN); Guangbing Chen, Chongqing (CN); Dongbing Fu, Chongqing (CN); Zicheng Xu, Chongqing (CN)

(73) Assignees: NO.24 RESEARCH INSTITUTE OF CHINA ELECTRONICS TECHNOLOGY GROUP CORPORATION, Chongqing (CN); Chongqing GigaChip Technology Co., Ltd., Chongqing (CN)

( * ) Notice: Subject to any disclaimer, the term of this patent is extended or adjusted under 35 U.S.C. 154(b) by 21 days.

(21) Appl. No.: 17/609,415

(22) PCT Filed: Jan. 7, 2020

(86) PCT No.: PCT/CN2020/070588
§ 371 (c)(1),
(2) Date: Nov. 8, 2021

(87) PCT Pub. No.: WO2020/224289
PCT Pub. Date: Nov. 12, 2020

(65) Prior Publication Data
US 2022/0224320 A1    Jul. 14, 2022

(30) Foreign Application Priority Data

May 9, 2019   (CN) .......................... 201910382143.6

(51) Int. Cl.
*H03K 5/24*      (2006.01)
*H03K 3/037*     (2006.01)

(52) U.S. Cl.
CPC ........... *H03K 5/2472* (2013.01); *H03K 3/037* (2013.01)

(58) Field of Classification Search
CPC ............. G01R 19/0038; H03K 5/2418; H03K 5/2445; H03K 5/2481
See application file for complete search history.

(56) References Cited

U.S. PATENT DOCUMENTS

| 6,104,066 A * | 8/2000 | Noble ................... H01L 27/092 |
| | | 257/370 |
| 9,378,780 B1 * | 6/2016 | Chang ...................... G11C 7/08 |

(Continued)

FOREIGN PATENT DOCUMENTS

| CN | 101355351 A | 1/2009 |
| CN | 101419249 A | 4/2009 |

(Continued)

*Primary Examiner* — Quan Tra

(57) ABSTRACT

The present disclosure provides a substrate-enhanced comparator and electronic device, the comparator including: a cross-coupled latch, for connecting input signals to the gate of a cross-coupled MOS transistor to form a first input of the latch; output buffers, connected to the cross-coupled latch for amplifying output signals of the latch; AC couplers, connected to the output buffers for receiving and amplifying the output signals of the latch, coupling the output signals to substrates of the cross-coupled MOS transistors to form second inputs of the latch. The cross-coupled latch is also for output signal regenerative latching based on input signals sampled at the first inputs and input signals sampled at the (Continued)

second inputs. The present disclosure introduces additional substrate inputs to the cross-coupled structure of the conventional latch as the second inputs of the latch.

12 Claims, 3 Drawing Sheets

(56) References Cited

U.S. PATENT DOCUMENTS

| | | | |
|---|---|---|---|
| 10,199,122 B2* | 2/2019 | Andre | G11C 11/1673 |
| 2009/0296506 A1* | 12/2009 | Chen | G11C 7/065 |
| | | | 365/205 |
| 2015/0102952 A1* | 4/2015 | Yang | H03K 5/2481 |
| | | | 341/161 |
| 2015/0341023 A1 | 11/2015 | Kushnarenko et al. | |

FOREIGN PATENT DOCUMENTS

| | | |
|---|---|---|
| CN | 103036538 A | 4/2013 |
| CN | 106160744 A | 11/2016 |
| CN | 108494406 A | 9/2018 |
| CN | 110098824 | 8/2019 |

* cited by examiner

SUBSTRATE-ENHANCED COMPARATOR AND ELECTRONIC DEVICE

CROSS REFERENCE TO RELATED APPLICATION

This is a Sect. 371 National Stage of PCT International Application No. PCT/CN2020/070588, filed on Jan. 7, 2020, which claims the benefit of priority to Chinese Patent Application No. CN 2019103821436, entitled "substrate-enhanced comparator and electronic device", filed with CNIPA on May 9, 2019, the disclosure of which is incorporated herein by reference in its entirety.

FIELD OF TECHNOLOGY

The present disclosure generally relates to technical field of mixed analog and digital integrated circuits, and in particular to a substrate-enhanced comparator and electronic device.

BACKGROUND

A comparator is an important component module of many integrated circuits (IC), such as analog-to-digital converter (ADC), operational transconductance amplifier (OTA), voltage reference source (VR) and clock data recovery circuit (CDR), which generates corresponding output by detecting differential input voltage and displays input voltage information of large amplitude. In modern communication systems, a low-voltage, high-speed comparator architecture is urgently needed due to the constant demand for lighter weight and smaller size in portable devices.

However, as the size of advanced CMOS processes has shrunk (to 40 nm and 28 nm, or even smaller), the supply voltage of the core circuit has followed suit, but the threshold voltage of the MOS cannot be reduced in the same proportion, which limits the common-mode input range of the comparator; more importantly, limited by the supply voltage and process characteristic frequency, the lower the supply voltage, the slower the latch in the comparator and it is unlikely to keep the comparator operating at high speed under low-voltage conditions (i.e., a supply voltage below 1.2V can be considered low-voltage).

SUMMARY

The present disclosure provides a substrate-enhanced comparator and electronic device for solving the problem that the speed of the latch is limited by the restricted supply voltage and the process characteristic frequency, resulting in the comparator not being able to achieve high speed in a low-voltage condition.

The present disclosure provides a substrate-enhanced comparator, including a cross-coupled latch, for connecting input signals to the gate of a cross-coupled MOS transistor to form a first input of the latch;

output buffers, connected to the cross-coupled latch, for amplifying output signals of the latch; and AC couplers, each connected to one of the output buffers, for receiving and further amplifying the output signals of the latch, and coupling the output signals to substrates of the cross-coupled MOS transistors for forming second inputs of the latch.

The cross-coupled latch is further configured for output signal regenerative latching based on input signals sampled at the first input and input signals sampled at the second input.

The present disclosure further provides an electronic device including a substrate-enhanced comparator as described above.

As described above, the substrate-enhanced comparator and electronic device of the present disclosure have the following beneficial effects:

The present disclosure introduces an additional substrate input in the cross-coupled structure of the conventional latch as the second input of the latch, which not only introduce the body transconductance of the cross-coupled MOS transistor into the input node, but also enhances the positive feedback capability and increases speed of the latch.

The substrate enhancement latching technology can effectively improve the latch sub-stable latching speed, break through the bottleneck of traditional latches that their latch regeneration speed is limited by the process characteristic frequency and supply voltage, and realize high-speed latches even in an advanced low-voltage process.

REFERENCE NUMERALS

1 Cross-coupled latch
2 Output buffer
3 AC coupler
4 Substrate common-mode resettor

DETAILED DESCRIPTION

The following describes the implementation of the present disclosure through specific examples, and those skilled in the art can easily understand other advantages and effects of the present disclosure from the content disclosed in this specification. The present disclosure can also be implemented or applied through other different specific embodiments. Various details in this specification can also be modified or changed based on different viewpoints and applications without departing from the spirit of the present disclosure. It should be noted that the following embodiments and the features in the embodiments can be combined with each other if no conflict will result.

It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout may also be more complicated.

Figure 1:
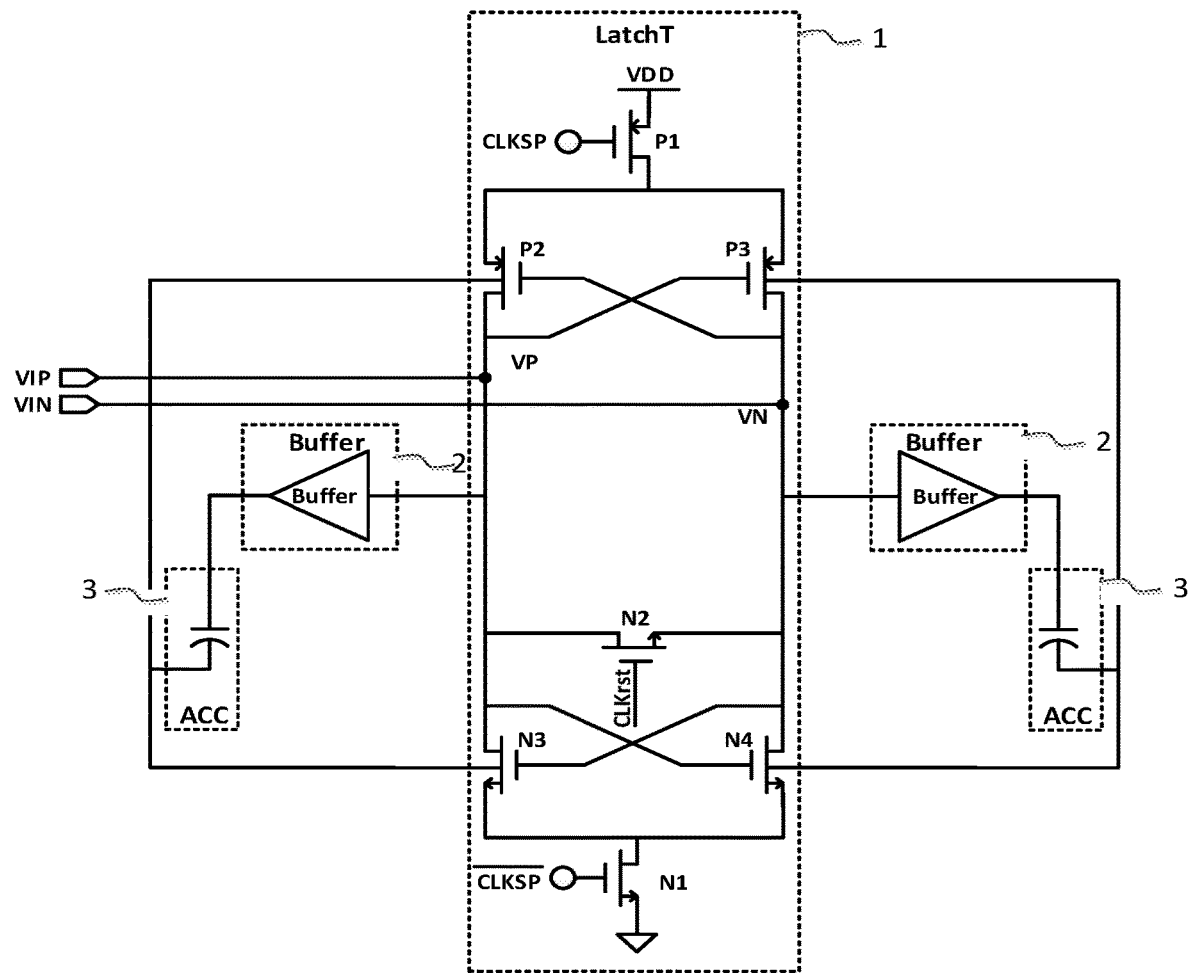
FIG. 1 shows a schematic diagram of a substrate-enhanced comparator provided by the present disclosure.

Referring to FIG. 1, the present disclosure provides a schematic diagram of a substrate-enhanced comparator including:

a cross-coupled latch 1, for connecting input signals to the gate of a cross-coupled MOS transistor to form a first input of the latch;

output buffers 2, connected to the cross-coupled latch for amplifying output signals of the latch;

AC couplers 3, each connected to one of the output buffers, for receiving and further amplifying the output signals of the latch, and coupling the output signals to substrates of the cross-coupled MOSs forming second inputs of the latch;

The cross-coupled latch is further configured for output signal regenerative latching based on input signals sampled at the first input and input signals sampled at the second input;

The substrates of the cross-coupled MOS transistors are made by a deep well process, for isolating the substrates of the MOS transistors from the outside to make its substrate coupling noise smaller and prevent crosstalk or mutual influence. The output buffers amplify the output signals in the same or opposite direction to ensure that cross-coupled MOS transistors on the same side have input signals with the same phase on their substrates, and on their gates. For example, the transistor P2 and transistor N3 are on the same side, and the transistor P3 and transistor N4 are on the other side, i.e., input signals on the substrate and the gate of the transistor P2 are in the same phase, input signals on the substrate and the gate of the transistor N3 are in the same phase, and so on.

Specifically, corresponding output node and input node of the cross-coupled latch are in the same position during resetting and latching phases. When the cross-coupled latch is in a sampling phase, the input node receives input signals, and when the cross-coupled latch is in the latching phase, the output node performs positive feedback output signal regeneration.

In the present disclosure, the latch, as the core unit of the traditional comparator, uses positive feedback for regenerative latching of sub-stable signals, while almost all current latches are designed using cross-coupled inverters, and the latching speed of this kind of structure is limited by the process characteristic frequency. With the development of advanced process technology, the power supply voltage of semiconductor chips is getting lower and lower, severely limiting latching speed of the traditional latch.

The present disclosure introduces an additional substrate input in the cross-coupled structure of the conventional latch as the second input of the latch, which not only introduce the body transconductance of the cross-coupled MOS transistor into the input node, but also enhances the positive feedback capability and increases speed of the latch.

Figure 2:
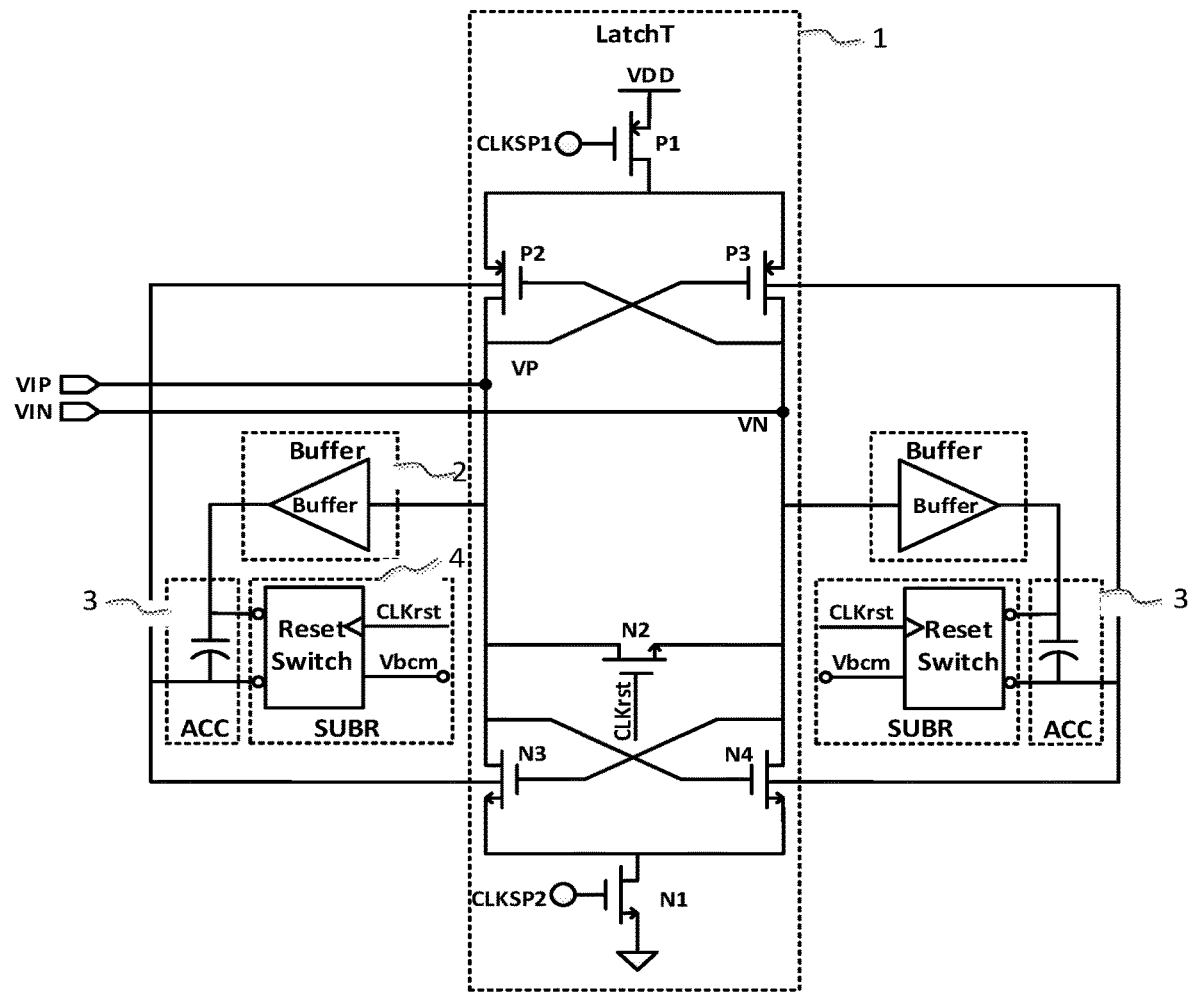
FIG. 2 shows a schematic diagram of an embodiment of a substrate-enhanced comparator provided by the present disclosure.

Please refer to FIG. 2 for a schematic diagram of an embodiment of a substrate-enhanced comparator provided by the present disclosure, the substrate-enhanced comparator including:

substrate common-mode resettors connected to the cross-coupled latch, and AC couplers, respectively, for common-mode resetting of the AC couplers and the substrates of the cross-coupled MOS transistors during a resetting phase.

The substrate common-mode resettors reset output nodes of the latch and the substrates of the cross-coupled MOS transistors during a resetting phase, with a corresponding reset voltage connected to different AC couplers for resetting according to respective transconductance of each NMOS transistor and PMOS transistor of the cross-coupled MOS transistors, and as long as the reset voltage does not make PN junctions of corresponding MOS transistor forward-conducting. The lower the reset voltage corresponding to PMOS transistors, the better; the higher the reset voltage corresponding to NMOS transistors, the better.

The disclosure introduces additional substrate inputs in the cross-coupled structure of the traditional latch as second inputs of the latch, which not only introduce body transconductance of the cross-coupled MOS transistors into the input nodes, but also enhances the positive feedback capability; and introduces common mode signals in the substrates of the cross-coupled MOS transistors to lower the threshold of the cross-coupled MOS transistors, thus increasing the effective transconductance and accelerating the latch speed.

The substrate enhancement latching technology of the present disclosure can effectively improve the latch sub-stable latching speed, break through the bottleneck of traditional latches that their latch regeneration speed is limited by the process characteristic frequency and supply voltage, and realize high-speed latches even in an advanced low-voltage process.

Figure 3:
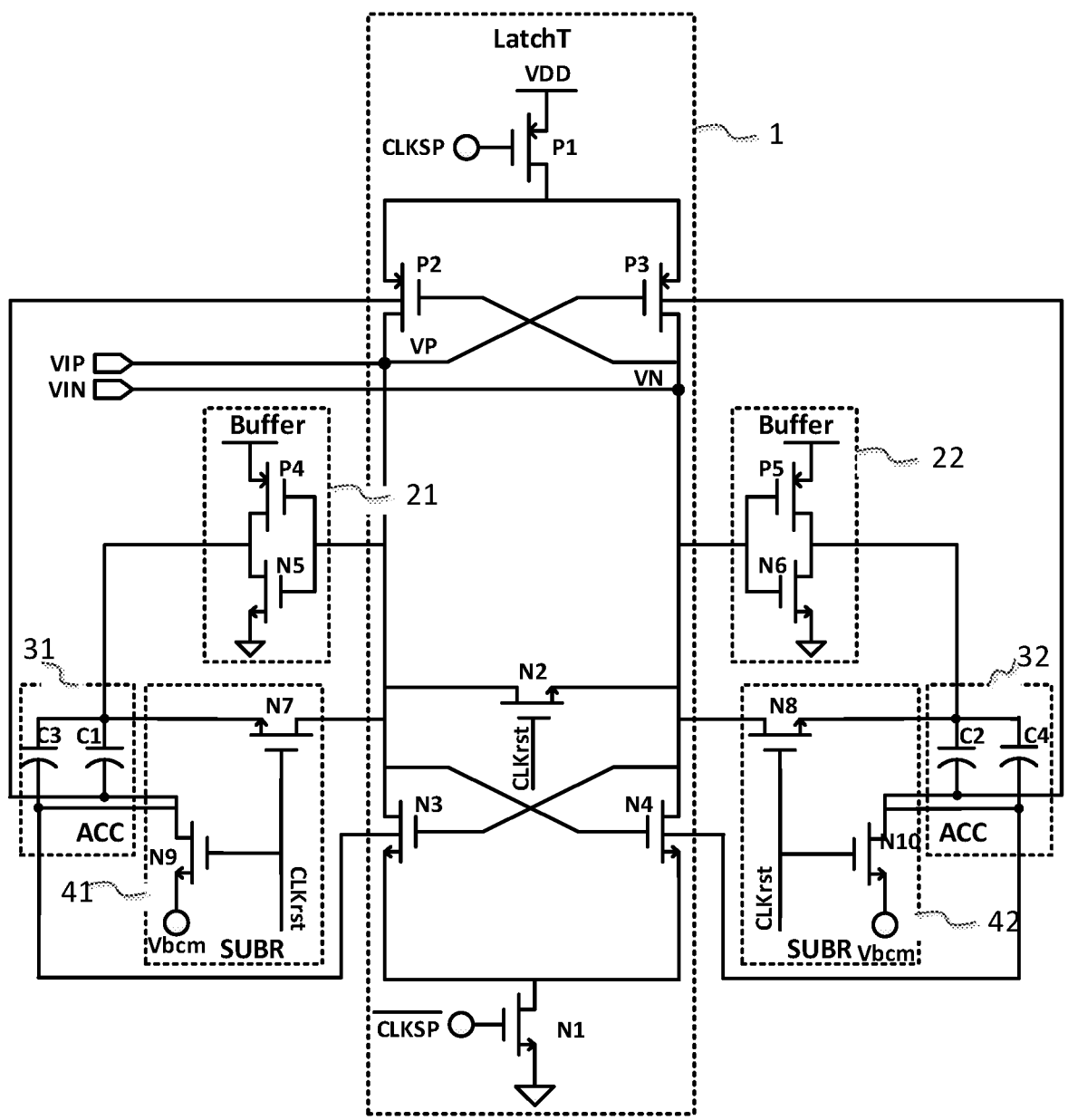
FIG. 3 shows a circuit diagram of a substrate-enhanced comparator provided by the present disclosure.

As shown in FIG. 3, showing an preferred embodiment based on FIG. 2, in which transistors P1, P2, P3, N1, N2, N3 and N4 constitute a cross-coupled latch LatchT; transistors P4 and N5, and P5 and N6 constitute push-pull amplifiers as output buffers (first output buffer 21 and second output buffer 21); transistors N7 and N9, and N8 and N10 constitute substrate common-mode resettors SUBR (first substrate common-mode resettor 41 and second substrate common-mode resettor 42); capacitors C1, C2, C3, and C4 constitute AC couplers (ACC) (first AC coupler 31 and second AC coupler 32).

Specifically, the cross-coupled latch includes transistors P1, P2, P3, N1, N2, N3, and N4, a gate of the transistor P1 is connected to a first clock signal, a source of the transistor P1 is connected to a supply voltage, a drain of the transistor P1 is connected to sources of the transistors P2 and P3 respectively; a first input signal is connected to a first output node formed by connecting a drain of the transistor P2, a gate of the transistor P3, the first input signal, drains of the transistors N2, N3, and a gate of the transistor N4; a second input signal is connected to a second output node formed by connecting a gate of the transistor P2, a drain of the transistor P3, a source of the transistor N2, a gate of the transistor N3 and a drain of the transistor N4; a gate of the transistor N1 is connected to a second clock signal, a gate of the transistor N2 is connected to a third clock signal, a drain of the transistor N2 is connected to sources of the transistors N3 and N4 respectively, a source of transistor N1 is grounded; substrates of the transistor P2 and the transistor N3 are interconnected, which are designated as substrates on a first side of the cross-coupled MOS transistors; substrates of the transistor P3 and the transistor N4 are interconnected, which are designated as substrates on a second side of the cross-coupled MOS transistors.

The output buffers 2 include a first output buffer 21 including transistors P4 and N5, and a second output buffer 22 including transistors P5 and N6. In the first output buffer 21, gates of the transistors P4 and N5 are connected to an output of the cross-coupled latch, a source of transistor P4 is connected to a supply voltage, a source of the transistor N5 is grounded, drains of the transistor P4 and N5 are interconnected as an amplifying output of the first output buffer 21; in the second output buffer 22, gates of the transistors P5 and N6 are connected to the other output of the cross-coupled latch, a source of the transistor P5 is connected to a supply voltage, a source of the transistor N6 is grounded, drains of the transistors P5 and N6 are interconnected as an amplifying output of the second output buffer 22.

The substrate common-mode resettors 4 include a first substrate common-mode resettor 41 including transistors N7 and N9 and a second substrate common-mode resettor 42 including transistors N8 and N10; gates of the transistors N7 and N9 in the first substrate common-mode resettor 41 are connected to a third clock signal, a drain of the transistor N7 is connected to an output of the cross-coupled latch, a source of the transistor N9 is connected to a common mode level, a source of the transistor N7 and a drain of the transistor N9 serve as two outputs of the first substrate common mode resettor 41; gates of the transistors N8 and N10 in the second substrate common mode resettor 42 are connected to the third clock signal, a drain of the transistor N8 is connected to another output of the cross-coupled latch, a source of transistor N10 is connected to a common mode level, and a source of the transistor N8, and a drain of the transistor N10 serve as two outputs of the second substrate common-mode resettor 42.

The AC couplers 3 include a first AC coupler 31 including a first capacitor and a third capacitor, a second AC coupler 32 including a second capacitor and a fourth capacitor. When the comparator does not have a substrate common-mode resettor, the AC couplers are connected as follows:

upper plates of the first capacitor C1 and third capacitor C3 are connected to an output of the first output buffer 21, and a lower plate of the first capacitor C1 is connected to a first substrate on the first side of the cross-coupled MOS transistors, and the lower plate of the third capacitor C3 is connected to a second substrate on the first side of the cross-coupled MOS transistors; upper plates of the second capacitor C2 and fourth capacitor C4 are connected to an output of the second output buffer 22, a lower plate of the second capacitor C2 is connected to a first substrate on the second side of the cross-coupled MOS transistors, and a lower plate of the fourth capacitor C4 is connected to a second substrate on the second side of the cross-coupled MOS transistors. When the comparator has a substrate common mode resettor, the AC couplers are connected as follows.

upper plates of the first capacitor and third capacitor are connected to an output of the first output buffer and a first output of the first substrate common-mode resettor, and a lower plate of the first capacitor is connected to a first substrate on the first side of the cross-coupled MOS transistors and a second output of the first substrate common-mode resettor, and the lower plate of the third capacitor is connected to a second substrate on the first side of the cross-coupled MOS transistors and the second output of the first substrate common-mode resettor; upper plates of the second and fourth capacitors are connected to an output of the second output buffer and a first output of the second substrate common-mode resettor, a lower plate of the second capacitor is connected to a first substrate on the second side of the cross-coupled MOS transistors and a second output of the second substrate common-mode resettor, and a lower plate of the fourth capacitor is connected to a second substrate on the second side of the cross-coupled MOS transistors and the second output of the second substrate common-mode resettor.

The first capacitor C1 and the second capacitor C2 have the same capacitance and provide the reset voltage to the transistors P2 and P3, respectively, and the third capacitor C3 and the fourth capacitor C4 have the same capacitance and provide the reset voltage to the transistors N3 and N4, respectively.

Figure 4:
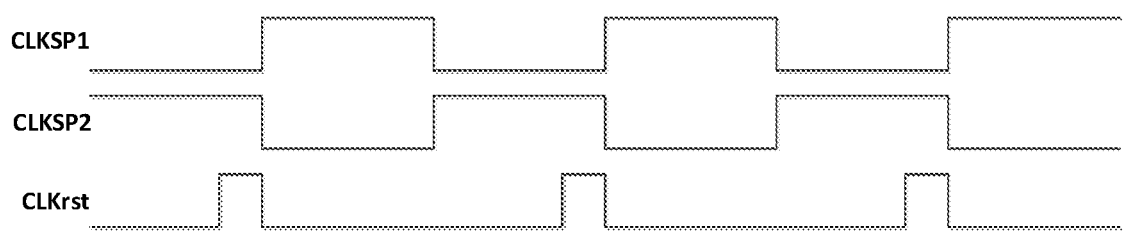
FIG. 4 shows a timing diagram of a substrate-enhanced comparator based on FIG. 3 provided by the present disclosure.

As shown in FIG. 4, which is a timing diagram of an embodiment based on FIG. 3, when the third clock signal CLKrst is a high level, switches N2, N7, N8, N9 and N10 of the substrate common-mode resettor SUBR are on, output nodes VP and VN of the latch are shorted, the upper plates of AC coupling capacitors C1 and C2 are reset to the latch output common-mode, and their lower plates are connected to the common-mode level Vbcm.

When the first clock signal CLKSP1 is a high level and the second clock signal CLKSP2 is a low level, the latch enters the sampling phase and the switches P1, N1, N2, N7, N8, N9 and N10 are disconnected, and the output nodes VP and VN of the latch receive input signals, which first acts on the gates of the cross-coupled transistors P2, P3, N3 and N4 to form the first inputs of the latch; voltage at the output nodes of the latch acts on the upper plates of the AC coupling capacitors C1, C2, C3 and C4 through buffers, and then on the substrates of the cross-coupled transistors P2, P3, N3 and N4, forming the second inputs of the latch.

When the first clock signal CLKSP1 is a low level and the second clock signal CLKSP2 is a high level, the transistors P1 and N1 are turned on and the latch enters the latching phase and regenerates the output signals based on the input signals sampled from the first inputs, i.e., the output nodes VP and VN, and the input signals sampled from the second inputs formed by the substrates of the cross-coupled transistors P2, P3, N3 and N4.

The first clock signal CLKSP1 and the second clock signal CLKSP2 are equal in value and opposite in phase.

During the latching process, due to the adoption of the cross-coupled transistors P2, P3, N3 and N4 as the second inputs, the body transconductance is increased from that of the conventional latch, effectively speeding up the latch regeneration; on the other hand, due to the lower plates of the AC coupling capacitors C1, C2, C3 and C4 being connected to the reset level Vbcm during the resetting phase, threshold voltages of the cross-coupled transistors P2, P3, N3 and N4 in the sampling and latching process are reduced to further increase the sub-stable effective transconductance and speed of the latch.

The present disclosure also provides an electronic device including a substrate-enhanced comparator described above, which may be a circuit, an analog-to-digital converter, an analog-to-digital conversion system, etc.

In this embodiment, the circuit includes the above-mentioned substrate-enhanced comparator.

In this embodiment, the analog-to-digital converter includes: a sampling capacitor array, a dynamic comparator, and a successive approximation logic circuits. The sampling capacitor array is used to sample an analog input signal and input the sampled signal to a comparator. The sampled signal, after processing by the comparator, is input to the successive approximation logic circuit in order to output a digital signal. The comparator is the substrate-enhanced comparator described in any of the above embodiments.

In this embodiment, the analog-to-digital conversion system includes: an analog-to-digital converter, a digital processing and storage module circuit, and a switching array circuit, the switching array circuit being used to control the analog-to-digital converter by turning on/off to input an analog signal as well as a DC out-of-tune calibration of the analog-to-digital converter, the analog-to-digital converter including a sampling capacitor array, a comparator, and a successive approximation logic circuit, the sampling capacitor array being used to sampling an analog input signal and inputting the sampled signal into a comparator, where the sampled signal, after processing by the comparator, is input to the successive approximation logic circuit in order to output a digital signal, the comparator being a substrate-enhanced comparator described in any of the above embodiments.

In summary, the disclosure introduces additional substrate inputs in the cross-coupled structure of the traditional latch as second inputs of the latch, which not only introduce body transconductance of the cross-coupled MOS transistors into the input nodes, but also enhances the positive feedback capability; and introduces common mode signals in the substrates of the cross-coupled MOS transistors to lower the threshold of the cross-coupled MOS transistors, thus increasing the effective transconductance and accelerating the latch speed. The substrate enhancement latching technology can effectively improve the latch sub-stable latching speed, break through the bottleneck of traditional latches that their latch regeneration speed is limited by the process characteristic frequency and supply voltage, and realize high-speed latches even in an advanced low-voltage process. Therefore, the present disclosure effectively overcomes various shortcomings of the prior art and has a high value for industrial application.

The above-mentioned embodiments only exemplarily illustrate the principles and effects of the present disclosure, but are not used to limit the present disclosure. Any person skilled in the art may modify or change the above embodiments without violating the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A substrate-enhanced comparator, comprising:
   a cross-coupled latch, comprising cross-coupled Metal-Oxide-Semiconductor (MOS) transistors, wherein the cross-coupled latch connects input signals to gates of the cross-coupled MOS transistors to form first inputs of the cross-coupled latch;
   output buffers, connected to the cross-coupled latch, for amplifying output signals of the cross-coupled latch; and
   AC couplers, each connected to one of the output buffers, for receiving and further amplifying the output signals of the cross-coupled latch, and coupling the output signals to substrates of the cross-coupled MOS transistors for forming second inputs of the cross-coupled latch;
   wherein the cross-coupled latch is further configured for output signal regenerative latching based on input signals sampled at the first inputs and input signals sampled at the second inputs.

2. The substrate-enhanced comparator according to claim 1, wherein the substrates of the cross-coupled MOS transistors are made by a deep well process.

3. The substrate-enhanced comparator according to claim 1, wherein during resetting and latching phases, corresponding output node and input node of the cross-coupled latch are in the same position, which receives signals when the cross-coupled latch is in a sampling phase, and performs positive feedback output signal regeneration when the cross-coupled latch is in the latching phase.

4. The substrate-enhanced comparator according to claim 1, wherein the output buffers amplify the output signals of the cross-coupled latch in the same or opposite direction to ensure that cross-coupled MOS transistors on the same side have input signals with the same phase on their substrates, and on their gates.

5. The substrate-enhanced comparator according to claim 1, further comprising: substrate common-mode resettors connected to the cross-coupled latch, and AC couplers, respectively, for common-mode resetting of the AC couplers and the substrates of the cross-coupled MOS transistors during a resetting phase.

6. The substrate-enhanced comparator according to claim 5, wherein the substrate common-mode resettors reset output nodes of the cross-coupled latch and the substrates of the cross-coupled MOS transistors during a resetting phase, with a corresponding reset voltage connected to different AC couplers for resetting according to respective transconductance of each NMOS transistor and PMOS transistor of the cross-coupled MOS transistors.

7. The substrate-enhanced comparator according to claim 1, wherein the cross-coupled latch comprises transistors P1, P2, P3, N1, N2, N3, and N4, a gate of the transistor P1 is connected to a first clock signal, a source of the transistor P1 is connected to a supply voltage, a drain of the transistor P1 is connected to sources of the transistors P2 and P3 respectively; a first input signal is connected to a first output node formed by connecting a drain of the transistor P2, a gate of the transistor P3, the first input signal, drains of the transistors N2, N3, and a gate of the transistor N4; a second input signal is connected to a second output node formed by connecting a gate of the transistor P2, a drain of the transistor P3, a source of the transistor N2, a gate of the transistor N3 and a drain of the transistor N4; a gate of the transistor N1 is connected to a second clock signal, a gate of the transistor N2 is connected to a third clock signal, a drain of the transistor N2 is connected to sources of the transistors N3 and N4 respectively, a source of transistor N1 is grounded; substrates of the transistor P2 and the transistor N3 are interconnected, which are designated as substrates on a first side of the cross-coupled MOS transistors; substrates of the transistor P3 and the transistor N4 are interconnected, which are designated as substrates on a second side of the cross-coupled MOS transistors.

8. The substrate-enhanced comparator according to claim 7, wherein the output buffers comprise a first output buffer comprising transistors P4 and N5 and a second output buffer comprising transistors P5 and N6, in the first output buffer, gates of the transistors P4 and N5 are connected to an output of the cross-coupled latch, a source of transistor P4 is connected to a supply voltage, a source of the transistor N5 is grounded, drains of the transistors P4 and N5 are interconnected as an amplifying output of the first output buffer; in the second output buffer, gates of the transistors P5 and N6 are connected to the other output of the cross-coupled latch, a source of the transistor P5 is connected to a supply voltage, a source of the transistor N6 is grounded, drains of the transistors P5 and N6 are interconnected as an amplifying output of the second output buffer.

9. The substrate-enhanced comparator according to claim 8, wherein the AC couplers comprises a first AC coupler comprising a first capacitor and a third capacitor, and a second AC coupler comprising a second capacitor and a fourth capacitor; upper plates of the first capacitor and third capacitor are connected to an output of the first output buffer, and a lower plate of the first capacitor is connected to a first substrate on the first side of the cross-coupled MOS transistors, and a lower plate of the third capacitor is connected to a second substrate on the first side of the cross-coupled MOS transistors; upper plates of the second and fourth capacitors are connected to an output of the second output buffer, a lower plate of the second capacitor is connected to a first substrate on the second side of the cross-coupled MOS transistors, and a lower plate of the fourth capacitor is connected to a second substrate on the second side of the cross-coupled MOS transistors.

10. The substrate-enhanced comparator according to claim 5, wherein the substrate common-mode resettors comprise a first substrate common-mode resettor comprising transistors N7 and N9 and a second substrate common-mode resettor comprising transistors N8 and N10; gates of the transistors N7 and N9 in the first substrate common-mode resettor are connected to a third clock signal, a drain of the transistor N7 is connected to an output of the cross-coupled latch, a source of the transistor N9 is connected to a common mode level, a source of the transistor N7 and a drain of the transistor N9 serve as two outputs of the first substrate common mode resettor; gates of the transistors N8 and N10 in the second substrate common mode resettor are connected to the third clock signal, a drain of the transistor N8 is connected to another output of the cross-coupled latch, a source of transistor N10 is connected to a common mode level, and a source of the transistor N8, and a drain of the transistor N10 serve as two outputs of the second substrate common-mode resettor.

11. The substrate-enhanced comparator according to claim 10, wherein the AC couplers comprises a first AC coupler comprising a first capacitor and a third capacitor, and a second AC coupler comprising a second capacitor and a fourth capacitor;

upper plates of the first capacitor and third capacitor are connected to an output of the first output buffer and a first output of the first substrate common-mode resettor, and a lower plate of the first capacitor is connected to a first substrate on the first side of the cross-coupled MOS transistors and a second output of the first substrate common-mode resettor, and the lower plate of the third capacitor is connected to a second substrate on the first side of the cross-coupled MOS transistors and the second output of the first substrate common-mode resettor; upper plates of the second and fourth capacitors are connected to an output of the second output buffer and a first output of the second substrate common-mode resettor, a lower plate of the second capacitor is connected to a first substrate on the second side of the cross-coupled MOS transistors and a second output of the second substrate common-mode resettor, and a lower plate of the fourth capacitor is connected to a second substrate on the second side of the cross-coupled MOS transistors and the second output of the second substrate common-mode resettor.

12. An electronic device comprising the comparator of claim 1.

* * * * *